United States Patent [19]

Kiriaki et al.

[11] Patent Number: 5,006,853
[45] Date of Patent: Apr. 9, 1991

[54] HYSTERESIS INSENSITIVE ANALOG TO DIGITAL CONVERTER SYSTEM USING A COARSE COMPARATOR AND A FINE COMPARATOR

[75] Inventors: Sami Kiriaki, Garland; Khen-Sang Tan, Plano, both of Tex.

[73] Assignee: Texas Instruments Incorporated, Dallas, Tex.

[21] Appl. No.: 478,596

[22] Filed: Feb. 12, 1990

[51] Int. Cl.$^5$ .............................................. H03M 1/12
[52] U.S. Cl. .................................... 341/156; 341/167; 341/172
[58] Field of Search ............... 341/118, 119, 120, 131, 341/156, 161, 172, 167

[56] References Cited

U.S. PATENT DOCUMENTS

| | | | |
|---|---|---|---|
| 3,636,555 | 1/1972 | Waaben | 341/156 |
| 4,380,756 | 4/1983 | Worsman | 341/172 X |
| 4,410,879 | 10/1983 | Gumm et al. | 341/118 X |
| 4,593,271 | 6/1986 | Candy | 341/131 |
| 4,799,042 | 1/1989 | Confalonieri et al. | 341/118 |

Primary Examiner—Mark J. Reinhart
Assistant Examiner—Randy W. Gibson
Attorney, Agent, or Firm—James C. Kesterson; James T. Comfort; Melvin Sharp

[57] ABSTRACT

An analog to digital converter system (10) is disclosed which comprises an SAR logic circuit (12) which controls capacitor array control switches (14) which themselves control a capacitor array (16). A top plate (18) of the capacitor array (18) is selectively coupled to a coarse comparator (24) and a fine comparator (26). The outputs of the coarse comparator (24) and the fine comparator (26) are input into an error correction circuit (28). In operation, the coarse comparator (24) is used to approximate a predetermined number of the most significant bits of the digital word to be output by the system (10) while the fine comparator (26) is used to approximate the remaining bits of the digital word. In this manner, the coarse comparator (24) alone is subjected to the high voltages which might cause errors as a results of the hysteresis effect in the threshold voltages of the MOSFETs used to construct the comparators. The voltage shift as a result of this hysteresis is not a significant factor for the bits generated by the coarse comparator and as such the system (10) may accomplish high resolution analog to digital conversions.

12 Claims, 2 Drawing Sheets

| FINE COMPARATOR DECISION FOR $\{D_m\}$ | FINE COMPARATOR DECISION FOR $\{D_m+1\}$ | FINAL DECISION |
|---|---|---|
| 0 | 1 | $\{D_m\}$ |
| 0 | 0 | $\{D_m+1\}$ |
| 1 | 1 | $\{D_m-1\}$ |
| 1 | 0 | IMPOSSIBLE STATE |

FOR $V_{IN} \geq$ CODE ⇨ COMPARATOR OUTPUT = 0

FOR $V_{IN} <$ CODE ⇨ COMPARATOR OUTPUT = 1

WHERE $\{D_m\}$ IS THE UPPER m-BIT WOR

HYSTERESIS INSENSITIVE ANALOG TO DIGITAL CONVERTER SYSTEM USING A COARSE COMPARATOR AND A FINE COMPARATOR

TECHNICAL FIELD OF THE INVENTION

This invention relates in general to the field of electronic systems and, more particularly, to a method and system for converting an analog signal to a digital signal.

BACKGROUND OF THE INVENTION

A common form of analog to digital converter system [ADC system] uses an array of proportionately sized capacitors which are controlled by sequential approximation register logic [SAR logic]. In this variety of ADC system, a comparator is used to perform sequential comparisons of the input voltage to a threshold voltage associated with the comparator. Accordingly, the accuracy of the comparator in the system is vital to the accurate conversion of the analog signal to a representative digital value. Because of the design of conventional comparator circuits, hysteresis in the threshold voltage of the MOSFETs within the comparator can cause comparison errors when high voltages are placed on the inputs of the comparators. This hysteresis problem is a practical limitation when trying to implement high resolution ADC systems when the voltage shift resulting from the hysteresis becomes large when compared to the voltage step associated with the least significant bit position of the digital value output by the ADC system.

Accordingly, a need has arisen for a high resolution ADC system which converts an analog signal into a digital value but which allows for the effect of the hysteresis in the threshold voltage of the MOSFETs comprising the comparators used in the ADC system.

SUMMARY OF THE INVENTION

In accordance with the present invention, a circuit for converting an analog voltage signal into a digital value is provided. The circuit comprises a coarse comparator operable to generate a predetermined number of bits of the digital value. The circuit further comprises a fine comparator operable to generate the remaining bits of the digital value. In this manner, the generation of the least significant bits of the digital value will not be affected by the hysteresis effects of large voltages at the inputs to the comparator circuits.

According to one embodiment of the system of the present invention, the number of bits generated by the coarse comparator circuit is chosen such that the least significant bit generated by the coarse comparator corresponds to a voltage step less than the uncalibrated offset of the threshold voltage associated with the coarse comparator. In this manner, the coarse comparator can never generate a value which is in error more than a value of one in a least significant bit position of the value generated by the coarse comparator. An error correction circuit is then used to check the least significant bit generated by the coarse comparator. This procedure is accomplished by having the fine comparator determine a value for the least significant bit generated by the coarse comparator using the value that the coarse comparator found and a value of one greater than the value the coarse comparator found. From these two determinations, the accurate value of the least significant bit found by the coarse comparator can be determined and corrected.

BRIEF DESCRIPTION OF THE DRAWINGS

A more complete understanding of the present invention may be acquired by referring to the detailed description and claims when considered in connection with the accompanying drawings in which like reference numbers indicate like features and wherein:

DETAILED DESCRIPTION OF THE INVENTION

Figures 1, 2:
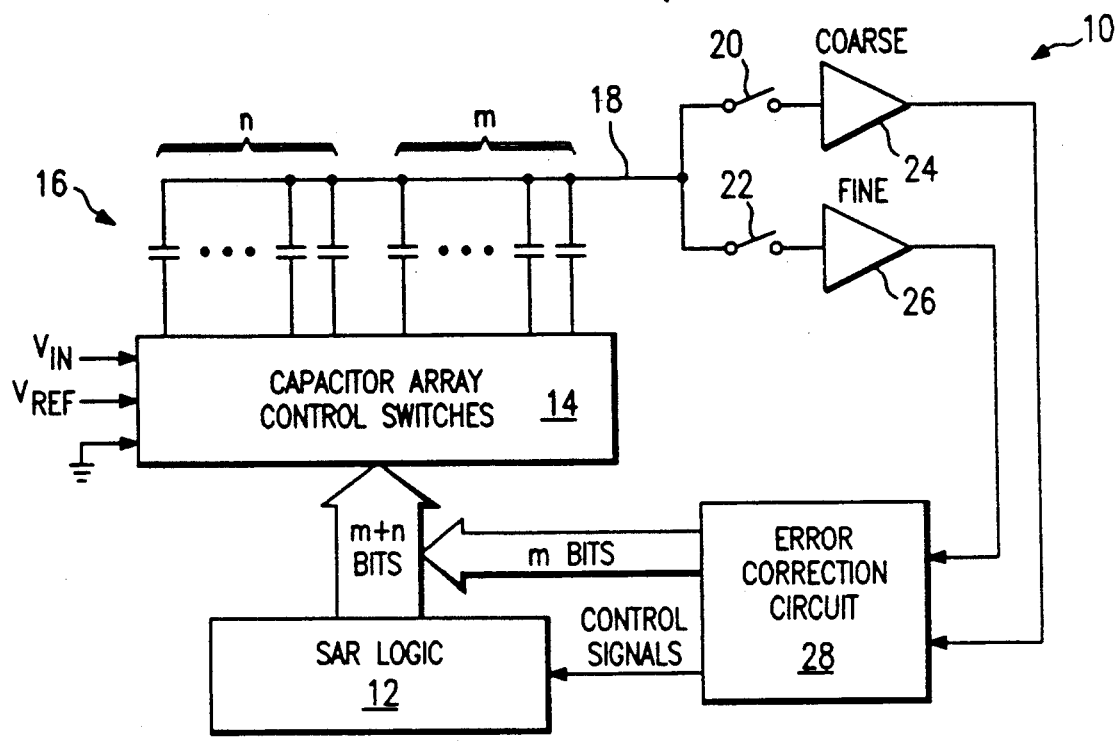
FIG. 1 is a block diagram of the analog to digital converter system of the present invention.
FIG. 2 is a truth table which illustrates the operation of the error correction circuit used in the analog to digital converter system of the present invention.

Referring to FIG. 1, an analog to digital converter system [ADC system], indicated generally at 10, constructed according to the teachings of the present invention is shown to comprise sequential approximation register [SAR logic] 12. SAR logic 12 is coupled to and controls a plurality of capacitor array control switches 14. The capacitor array control switches 14 are coupled to a capacitor array which is indicated generally at 16. There are a number of capacitors in capacitor array 16 equal to $m+n$, where $m+n$ equals the number of bits in the digital value output by ADC system 10. The capacitors in capacitor array 16 each have one of their two nodes coupled together at a top plate 18. Top plate 18 is coupled to a coarse switch 20 and a fine switch 22. The coarse switch 20 selectively couples the top plate 18 to the input of a coarse comparator 24. Similarly, the fine switch 22 selectively couples the top plate 18 to a fine comparator 26.

In operation, the m most significant bits of the digital value output by system 10 are determined by coarse comparator 24. The n least significant bits of the digital value output by system 10 are determined by the fine comparator 26.

The outputs of coarse comparator 24 and fine comparator 26 are input into an error correction circuit 28. Error correction circuit 28 outputs the m most significant bits of the digital value generated by system 10 to the capacitor array control switches 14. Additionally, error correction circuit 28 outputs a plurality of control signals to the SAR logic 12.

The operation of system 10 is similar to the operation of a conventional SAR ADC system with the exception of the use of error correction circuit 28 and the use of two comparators 24 and 26 in place of a single comparator. In summary, an input voltage $V_{in}$ comprising an analog signal to be converted to a digital value is sampled on capacitor array 16 using capacitor array control switches 14. Capacitor array 16 may be subject to error resulting from parasitic capacitances which may be corrected using a correction system such as is described in the copending concurrently filed application of Khen-Sang Tan entitled "Common Mode Error Self-Calibration Circuit and Method of Operation", issued as U.S. Pat. No. 4,989,002, which is hereby incorporated by referenced herein. Capacitor array 16 comprises $m+n$ capacitors which are proportionately sized such that the largest capacitor has a capacitance equal to $2^{m+n} * C_0$, where $C_0$ may be defined as a unit capacitance and may have a value on the order of, for example, one femtofarad. The largest capacitor is used to generate the most significant bit of the digital value and so on throughout the capacitor array 16 such that each capacitor within the array 16 is associated with a single bit output by system 10. The next most significant capacitor will thus have a value of $2^{m+n-1} * C_0$ and so on until the least significant capacitor which will have a value of $2^0 * C_0$. Using the capacitor array control switches 14, each of the capacitors is coupled to the input voltage $V_{in}$. These switches are then released and each of the capacitors in capacitor array 16 is coupled to ground potential. At this point, the voltage on top plate 18 is given by the following expression:

$$V_{top} = -Q_{in}/C_{total} = -V_{in}$$

where $C_{total} = C_0 * 2^{m+n+1}$ or the total capacitance of array 16 and $Q_{in}$ is the charge stored in array 16.

The successive approximation algorithm begins by coupling the most significant capacitor to a reference voltage $V_{ref}$. At this point, the voltage on the top plate 18 is given by the following expression:

$$V_{top} = -V_{in} + V_{ref} * (2^{m+n} \times C_0/C_{tot})$$

$$V_{top} = -V_{in} + V_{ref} * \tfrac{1}{2}$$

Coarse switch 20 is then closed and a decision is made by coarse comparator 24. Coarse comparator 24 compares the voltage $V_{top}$ on top plate 18 to the threshold voltage of the coarse comparator 24. This comparison decides whether or not the voltage $V_{in}$ is larger or smaller than the voltage associated with the binary bit associated with the most significant capacitor. If the coarse comparator 24 determines that the voltage is equal to or larger than the voltage associated with the most significant bit of the digital word to be output by system 10, a logical one is output by coarse comparator 24 and is logged within SAR logic 12. If the voltage $V_{in}$ is smaller than the voltage associated with the most significant capacitor, a logical zero is output by coarse comparator 24 and is logged in SAR logic 12 for the most significant bit of the digital value to be output by system 10.

The remaining bits of the digital value to be output by system 10 are generated in a similar manner according to the known operation of an SAR ADC system. During this approximation procedure, the voltage on the top plate 18 is given by the general expression:

$$V_{top} = -V_{in} + V_{ref}*D_{MSB}/2 + V_{ref}*D_{MSB}/4 + \ldots + V_{ref}*D_{LSB}/2^{m+n}$$

where $D_{MSB}, D_{MSB-1}, \ldots D_{LSB}$ are the logical values of each bit in the digital value.

The ADC system 10 of the present invention differs from prior ADC systems in that it uses two independent comparators 24 and 26 to accomplish the successive approximations in the generation of the digital word output by system 10. The coarse comparator 24 is used for the determination of the m most significant bits of the output digital value. The fine comparator 26 is then used to determine the n remaining bits of the digital value as apparent in the above expression, as the successive approximation proceeds, the magnitude of the voltage on the top plate 18, $V_{top}$, grows successively smaller. Accordingly, the determination of the most significant bit requires the largest voltage to be placed on the input of coarse comparator 24. The hysteresis problem associated with large voltages is only a problem if the voltage shift as a result of the hysteresis is large compared to the voltage differentiation required of the voltage comparator 24 and 26. Accordingly, in operation of system 10, the coarse comparator 24 is only used to determine the first m bits of the digital value output by system 10. The number of bits m chosen to be determined by coarse comparator 24 is a function of the uncorrected and uncalibrated comparator offset associated with coarse comparator 24. The upper m bit number must be chosen to have a least significant bit which is greater than the uncalibrated comparator offset associated with coarse comparator 24.

After the coarse comparator 24 has been used to determine the first m bits of the digital value, coarse switch 20 is opened and fine switch 22 is closed and the fine comparator 26 is used to determine the remaining n bits of the digital value. The voltage on the top plate $V_{top}$ seen at the input of the fine comparator 26 is many orders of magnitude smaller than the largest voltage seen by the coarse comparator 24. For example, if system 10 were used to generate a sixteen bit digital value and m and n were both equal to eight, the largest voltage seen by fine comparator 26 would be 256 times smaller than the largest voltage seen by coarse comparator 24. Accordingly, the fine comparator 26 may be used to determine the bits of lesser significance which require fine voltage differentiation due to the smaller steps associated with the lower significant bits.

The error correction circuit 28 functions to correct errors which the coarse comparator 24 may have made in determining the $m^{th}$ bit of the digital value to be output by system 10. As discussed previously, the number of bits determined by the coarse comparator 24, which is given as m in the present example, is chosen such that the coarse comparator 24 can never have an error that is greater than one place in the $m^{th}$ position of the digital value output by system 10.

With these constraints, there are three possibilities for the output of the coarse comparator 24 which must be corrected by error correction circuit 28. The first possibility is that the coarse comparator 24 actually output a value of $\{D_m + 1\}$ where $D_m$ is given as the correct digital value to m places of resolution. In this instance, the error correction circuit 28 must subtract one from the value output by the coarse comparator 24 to achieve the appropriate value as given by the following expression:

$$\{D_m + 1\} - 1 \equiv \{D_m\}$$

If the output of coarse comparator 24 was erroneous in that it was one less than the correct value $\{D_m\}$, then the error correction circuit 28 must add one to the value output by coarse comparator 24 as given by the following expression:

$$\{D_m - 1\} + 1 \equiv \{D_m\}$$

The third possibility is that the coarse comparator output was correct and in this case the error correction circuit 28 must do nothing as given by the following expression:

$$\{D_m\} \equiv \{D_m\}$$

As discussed previously, if the number of bits determined by the coarse comparator 24 given by the variable m in the present example is chosen correctly, the error correction circuit 28 will not have to correct for more than one least significant bit of error in the value $\{D_m\}$.

According to one embodiment of the present invention, the fine comparator 26 is used to test the accuracy of the $m^{th}$ bit determined by the coarse comparator 24. The fine comparator is used to determine the value of the $m^{th}$ bit using the bit settings corresponding to the value of $\{D_m\}$. Subsequently, the fine comparator 26 is used to determine the value of the $m^{th}$ bit for values of the m bits corresponding to a value of $\{D_m+1\}$. From these two determinations made by the fine comparator 26 for the $m^{th}$ bit position, the actual value of the $m^{th}$ bit can be determined.

FIG. 2 illustrates a truth table 30 which is implemented in logic in the error correction circuit 28 to implement the aforedescribed functionality. A first column of truth table 30 illustrates the possible determinations made by fine comparator 26 for the value $\{D_m\}$. The second column of truth table 30 illustrates the possible determinations made by fine comparator 26 for the value $\{D_m1\}$. A third column of truth table 30 illustrates the conclusion reached from the prior two columns. For example, a value of zero in the first column of truth table 30 and a value of one in the second column of truth table 30 indicates that the original determination made by coarse comparator 24 corresponded to the accurate value of $D_m$. Further, a value of zero in the first column and a value of zero in the second column indicates that the coarse comparator 24 had output a value which was one greater than the actual value of the m most significant bits of the digital value to be output by system 10. Further, a value of one in the first column and a value of one in the second column indicates that the value output by the coarse comparator 24 was one less than the actual value of the m most significant bits of the digital value to be output by system 10. A value of one in the first column and a value of zero in the second column is an impossible state which cannot occur in the implementation of the present embodiment. The truth table 30 assumes that an input voltage which is greater than or equal to the appropriate code value corresponds to a comparator output of a logical zero. An input voltage which is less than the code value corresponds to a comparator output which is equal to a logical one.

It should be understood that the presentation of system 10 comprising two comparators should not be construed to limit the scope of the present invention. The use of more than two comparators for the implementation of extremely high resolution ADC systems is intended to be included within the scope of the present invention. For example, an even finer comparator could be added to system 10 to provide for even greater resolution and could check the final bit generated by fine comparator 26 just as fine comparator 26 checked the final bit generated by coarse comparator 24.

Figure 3:
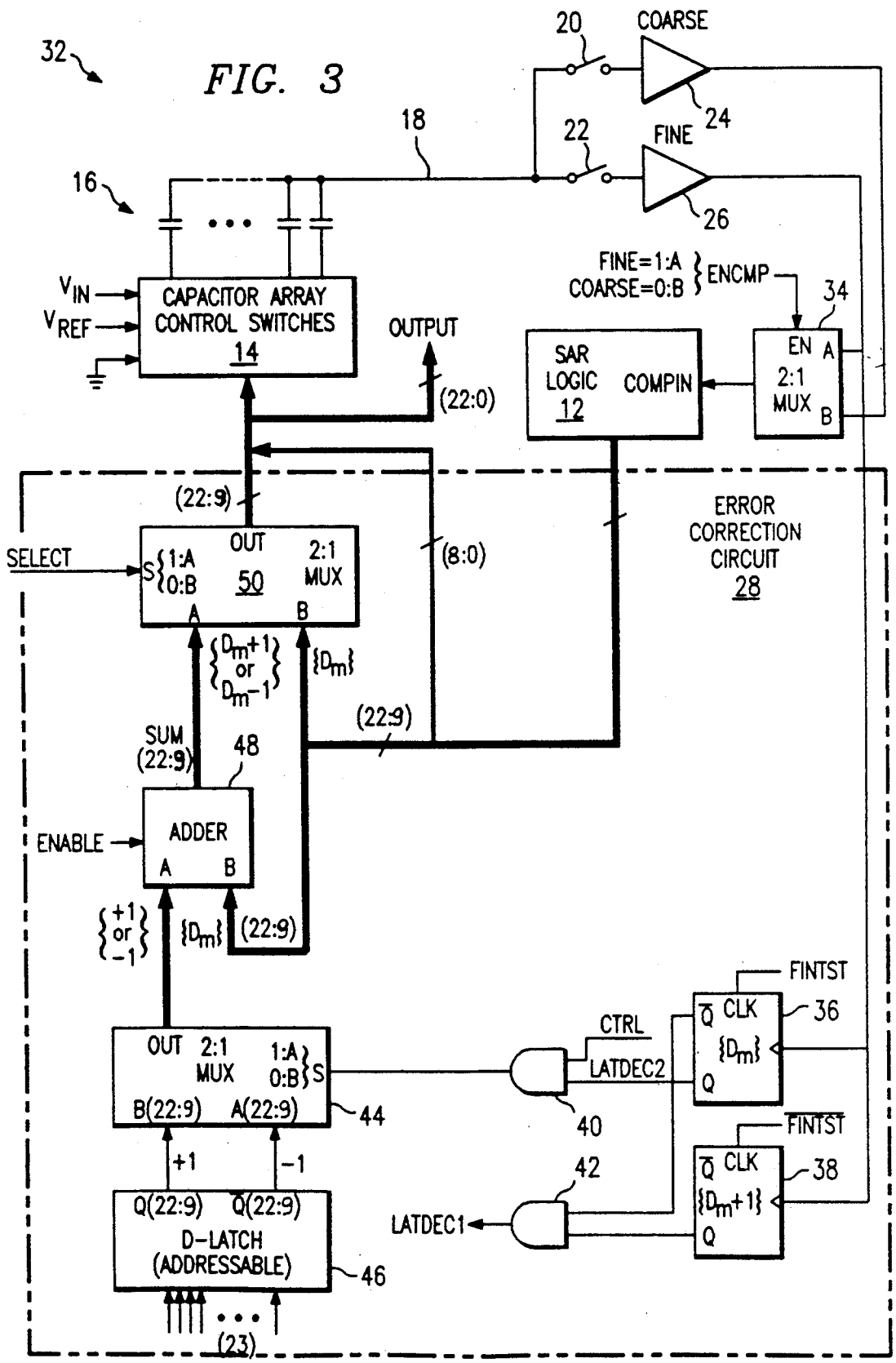
FIG. 3 is a schematic diagram of one possible embodiment of the analog to digital converter system of the present invention.

FIG. 3 illustrates one possible embodiment of the ADC system of the present invention. The embodiment shown in FIG. 3 is presented solely for the purposes of teaching the present invention and should not be construed to limit the scope of the present invention to this or any embodiment, the scope of the present invention solely being limited by the appended claims.

FIG. 3 illustrates an ADC system 32 which describes various components described with reference to FIG. 1, for example, system 32 comprises SAR logic 12, capacitor rate control switches 14, capacitor array 16 coupled to top plate 18. Further, system 32 comprises coarse switch 20 selectively coupling coarse comparator 24 to top plate 18 and fine switch 22 selectively coupling fine comparator 26 to top plate 18. System 32 receives an analog input voltage, $V_{in}$, and outputs a twenty-three bit digital value representative of $V_{in}$. System 32 uses coarse comparator 24 to find fourteen bits of the twenty-three bit value and uses fine comparator 26 to find the remaining nine bits. Hence, m is equal to fourteen and n is equal to nine for the configuration of system 32 shown in FIG. 3 using the terminology used with reference to system 10 described previously. Bit position nine, therefore, corresponds to the $m^{th}$ bit position where bit position zero is defined as the least significant bit position.

The output of coarse comparator 24 and fine comparator 26 are input into a 2:1 MUX 34. An ENCMP signal is used to select which of the two comparator outputs are to be input into a compin port of SAR logic 12. A logical one value for the ENCMP signal will select the output of the fine comparator 26 to the input into SAR logic 12.

The output of fine comparator 26 is input into a first flip-flop 36 and a second flip-flop 38. First flip-flop 36 is controlled through its clock input by a FINTST signal while second flip-flop 38 is controlled by the inverse FINTST signal. First flip-flop 36 is used to store the value found by fine comparator 26 for bit position nine using the original settings of the value found for $\{D_m\}$ by coarse comparator 24. Similarly, second flip-flop 38 is used to store the value for bit position nine found by fine comparator 26 for the value corresponding to $\{D_m+1\}$ of the fourteen most significant bits found by coarse comparator 24. The inverse Q output of flip-flop 36 and the Q output of flip-flop 38 are input into an AND gate 40 whose output is the LATDEC1 signal. The Q output of flip-flop 36 corresponds to the LATDEC2 signal. The LATDEC2 signal together with a CTRL timing signal are input into an AND gate 42 whose output is connected to the select input of a 2:1 MUX 44. MUX 44 has two inputs which are coupled to a Q and a inverse Q output of an addressable D latch 46. D latch 46 is used to store a value representing either $+1$ or $-1$. The select signal output by AND gate 42 is used to select whether a $+1$ or a $-1$ will be output by 2:1 MUX 44 to the A input of an adder 48. Adder 48 receives either a $+1$ or a $-1$ from MUX 44 and adds it upon receiving an enable signal to the fourteen most significant bits which are output by SAR logic 12. The sum output by adder 48 corresponds to either a value of $\{D_m+1\}$ or $\{D_m-1\}$ depending upon the signal output by AND gate 42. This sum is input into a 2:1 MUX 50. The fourteen bit value for $\{D_m\}$ is output into the B input of MUX 50 from SAR logic 12. The output of MUX 50 is selected using a SELECT signal which is a function of various timing signals, including the FINTST signal, and the LATDEC1 signal. Accordingly, depending upon the decisions made by the fine comparator 26 in testing the final bit position determined by coarse comparator 24, either the value of $\{D_m\}$, the value of $\{D_m+1\}$, or the value of $\{D_1-1\}$ is output from MUX 50. The output of MUX 50 is also input into capacitor array control switches 14 to control the further determination of the remaining nine bits using fine comparator 26 and SAR logic 12.

It should be understood that system 32 is programmable in the sense that the division of the twenty-three bits between the coarse and fine comparators, 20 and 22, can be selected through the programming of D-latch 46 and the alteration of the control signals SELECT, ENABLE, CTRL, FINTST and ENCMP. These signals may be generated by a state machine [not shown] which is programmable using known methods to allow for values of m and n anywhere within the twenty-three bit range of resolution. The MUXes 44 and 50 and adder 48 are operable to receive and operate on values regardless of what values for m and n are chosen. The presentation of the embodiment shown should therefore not be construed to limit the scope of the present invention to this or any particular embodiment.

Further, the circuitry used to implement error correction circuit 28 in system 32 is shown solely for the purposes of teaching the present invention and should not be construed to limit the scope of the present invention to the embodiment shown or any particular embodiment. A variety of logic schemes could be used to implement the truth table shown in FIG. 2 and all such embodiments are intended to be included within the scope of the present invention.

Accordingly, the large voltages which result in the hysteresis effects are seen only by the coarse comparator which is not called upon to make the fine decisions where the hysteresis effects could prove to be an error-introducing factor. As long as the number of bits to be approximated by the coarse comparator is chosen such that the least significant bit of this number of bits has a value which corresponds to less than the uncorrected comparator, the correction technique described above will correct for any possible errors in the final bit approximated by the coarse comparator.

Although the present invention has been described in detail, it should be understood that various changes, substitutions and alterations can be made hereto without departing from the spirit and scope of the invention as defined by the appended claims.

What is claimed is:

1. A circuit for converting an analog signal into a digital value comprising
   a plurality of bits, the circuit comprising:
   a capacitor array comprising a capacitor corresponding to each bit in the digital value;
   a top plate coupling together a first node of each capacitor in said array;
   capacitor control switching means operable to selectively couple a second node of said capacitors to a reference signal and said analog signal;
   a coarse comparator circuit having an input and an output and operable to generate a predetermined number of most significant bits of the plurality of bits representing said digital value;
   a fine comparator circuit having an input and an output and operable to generate the remaining bits of said plurality of bits representing said digital value such that the generation of the least significant bits of the digital value will not be affected by hystersis effects of large voltages at the inputs to said comparator circuit;
   a course switch operable to selectively couple said top plate to said input or said course comparator circuit; and
   a fine switch operable to selectively couple said top plate to said input of said fine comparator circuit.

2. The circuit of claim 1 and further comprising:
   first sequential circuitry coupled to selected ones of said capacitor control switches corresponding to said capacitors corresponding to said predetermined number of most significant bits, said first sequential circuitry operable to sequentially couple said predetermined number of said capacitors to said reference voltage; and
   coarse storage circuitry coupled to said output of said coarse comparator circuit and operable to log a first set of results of sequential comparisons of a voltage on said top plate to a threshold voltage associated with said coarse comparator circuit, said coarse comparator circuit operable to make said sequential comparisons as each of said capacitors associated with said predetermined number of the most significant bits of the digital value is sequentially coupled to said reference voltage, said first set of results comprising said predetermined number of the most significant bits of the digital value.

3. The circuit of claim 2 and further comprising:
   second sequential circuitry coupled to selected ones of said capacitor control switches corresponding to said capacitors corresponding to the remaining bits of the digital value,
   said second sequential circuitry operable to sequentially couple said remaining capacitors to said reference voltage; and
   fine storage circuitry coupled to said output of said fine comparator circuit and operable to log a second set of results of sequential comparisons of a voltage on said top plate to a threshold voltage associated with said fine comparator circuit, said fine comparator circuit operable to make said sequential comparisons as each of said capacitors associated with the remaining bits of the digital value is sequentially coupled to said reference voltage, said second set of results comprising the remaining bits of the digital value.

4. A circuit for converting an analog voltage signal into a digital value comprising a plurality of bits, the circuit comprising:
   a coarse comparator circuit having an input and an output and operable to generate a predetermined number of the most significant of the bits;
   a fine comparator circuit having an input and an output and operable to generate the remaining bits of the plurality such that the generation of the least significant bits of the digital value will not be affected by hysteresis effects of large voltages at said inputs to said comparator circuit;
   a capacitor array comprising a capacitor corresponding to each bit in the digital value;
   a top plate coupling together a first node of each of said capacitors;
   a capacitor control switch associated with each of said capacitors and operable to selectively couple a second node of each of said capacitors to a reference voltage, a predetermined voltage level and the analog voltage signal;
   circuitry coupled to each of said capacitor control switches for sequentially coupling said second node of each of said capacitors to said reference voltage;
   circuitry for selectively coupling said top plate to said input of said coarse comparator circuit;

coarse storage circuitry coupled to said output of said coarse comparator circuit and operable to log a first set of results of sequential comparisons of a voltage on said top plate to a threshold voltage associated with said coarse comparator circuit, said coarse comparator circuitry operable to make said sequential comparisons as each of said capacitors associated with said predetermined number of the most significant bits of the digital value is sequentially coupled to said reference voltage, said first set of results comprising said predetermined number of the most significant bits of the digital value;

circuitry for selectively coupling said top plate to said input of said fine comparator circuit;

fine storage circuitry coupled to said output of said fine comparator circuit and operable to log a second set of results of sequential comparisons of a voltage on said top plate to a threshold voltage associated with said fine comparator circuit, said fine comparator circuit operable to make said sequential comparisons as each of said capacitors associated with the remaining bits of the digital value is sequentially coupled to said reference voltage, said second set of results comprising the remaining bits of the digital value;

circuitry for generating a first value for the least significant bit of the predetermined number of bits using the bits generated by the coarse comparator circuit;

circuitry for generating a second value for the least significantly bit of the predetermined number of bits using a value corresponding to the bits generated by said coarse comparator circuit with one added to the least significant bit position, the first and second values determining the accurate value of the least significant bit of the bits generated by the course comparator circuit; and circuitry for selectively correcting the digital value responsive to selected values for said first and second values.

5. A method for converting an analog signal into a digital value comprising a plurality of bits, the method comprising the steps of:

generating a predetermined number of the most significant of the bits using a coarse comparator circuit; and generating the remaining bits of the plurality using a fine comparator circuit such that the generation of the least significant bits of the digital value will not be affected by hystersis effects of large voltages on the inputs to the comparator circuits;

generating a first value for the least significant bit of the predetermined number of bits using the fine comparator circuit and the remaining bits generated by the coarse comparator circuit;

generating a second value for the input significant bit of the predetermined number of bits using the fine comparator circuit and a value corresponding to the bits generated by the coarse comparator with one added to the least significant bit position, the first and second values determining the accurate value of the least significant bit of the bits generated by the coarse comparator circuit; and selectively correcting the digital value responsive to said step of checking.

6. A circuit for converting an analog signal into a digital value comprising a plurality of bits, the circuit comprising:

a coarse comparator circuit having an input and an output and operable to generate a predetermined number of most significant bits of the plurality;

a fine comparator circuit having an input and an output and operable to generate the remaining bits of the plurality such that the generation of the least significant bits of the digital value will not be affected by hysteresis effects of large voltages at the inputs to said comparator circuit;

circuitry for generating a first value for the least significant bit of the predetermined number of bits using the bits generated by the coarse comparator circuit;

circuitry for generating a second value for the least significant bit of the predetermined number of bits using a value corresponding to the bits generated by the coarse comparator with one added in the least significant bit position, the first and second values determining the accurate value of the least significant bit of the bits generated by the coarse comparator circuit; and circuitry for selectively correcting the digital value responsive to said circuitry for checking.

7. A circuit for converting an analog signal into a digital value comprising a plurality of bits, the circuit comprising:

a coarse comparator circuit having an input and an output and operable to generate a predetermined number of most significant bits of the plurality;

a fine comparator circuit having an input and an output and operable to generate the remaining bits of the plurality such that the generation of the least significant bits of the digital value will not be affected by hysteresis effects of large voltages at the inputs to said comparator circuit;

a capacitor array comprising a capacitor corresponding to each bit in the digital value;

a top plate coupling together a first node of each of said capacitors;

a coarse switch operable to selectively couple said top plate to said input of said coarse comparator circuit; and a fine switch operable to selectively couple said top plate to said input of said fine comparator circuit.

8. A method for converting an analog signal into a digital value comprising a plurality of bits, the method comprising the steps of:

generating a predetermined number of the most significant of the bits using a coarse comparator circuit; and generating the remaining bits of the plurality using a fine comparator circuit such that the generation of the least significant bits of the digital value will not be affected by hysteresis effects of large voltages on the inputs to the comparator circuits;

providing an array of capacitors each one of said provided capacitors corresponding to a bit in said digital value;

coupling together one mode of each of said capacitors with a top plate; and selectively switching said top plate between said coarse comparator circuit and said fine comparator circuit.

9. The method of claim 8, wherein said step of generating a predetermined number of the most significant of the bits comprises the steps of:

sequentially comparing a voltage on said top plate of said capacitor array to a threshold voltage associated with the coarse comparator circuit; and logging the results of said step of sequentially comparing in a storage circuit, the results comprising the predetermined number of the most significant bits of the digital value.

10. The method of claim 8 wherein said step of generating the remaining bits comprises the steps of:

sequentially comparing a voltage on said top plate of said capacitor array to a threshold voltage associated with the fine comparator circuit; and logging the results of said step of sequentially comparing in a storage circuit, the results comprising the remaining bits of the digital value.

11. A method for converting an analog voltage signal into a digital value comprising a plurality of bits, the method comprising the steps of:

simultaneously coupling a first node of each capacitor in a capacitor array to the analog voltage signal, the number of capacitors in the capacitor array corresponding to the number of bits in the digital value, a second node of each of the capacitors coupled to a top plate, the capacitors being proportionately sized such that the size of a particular capacitor corresponds to the significance of the bit position associated with the particular capacitor;

simultaneously coupling the first node of each of the capacitors to a predetermined voltage level;

sequentially coupling the first nodes of a predetermined number of the largest capacitors to a reference voltage;

sequentially comparing using a coarse comparator the voltage on the top plate with a predetermined threshold voltage associated with the coarse comparator simultaneously with said step of sequentially coupling the first nodes of a predetermined number of the largest capacitors;

selectively decoupling the first nodes of selected ones of the capacitors responsive to said step of comparing;

logging in a storage circuit the results of said step of comparing using a coarse comparator, the results comprising the predetermined number of the most significant bits of the digital value;

sequentially coupling the first nodes of the remaining capacitors to the reference voltage;

sequentially comparing using a fine comparator the voltage on the top plate with a predetermined threshold voltage associated with the fine comparator simultaneously with said step of sequentially coupling the first nodes of the remaining capacitors; and logging in a storage circuit the results of said step of comparing using a fine comparator, the results comprising the remaining bits of the digital value.

12. The method of claim 11 and further comprising the steps of:

redetermining a first value of the least significant bit determined using the coarse comparator using the fine comparator;

storing the result of said step of redetermining;

determining a second value of the least significant bit determined using the coarse comparator with the predetermined number of capacitors corresponding to the predetermined number of most significant bits in the digital value coupled such that a value of one greater than the value determined using the coarse comparator is represented; and selectively correcting the digital value logged in the storage circuit responsive to said steps of redetermining and determining, the first and second values indicative of the accurate value for the least significant bit determined by the coarse comparator.

* * * * *